(12) United States Patent
Valero

(10) Patent No.: US 11,211,928 B1
(45) Date of Patent: Dec. 28, 2021

(54) APPARATUS AND METHOD FOR POWER SWITCH STATUS CHECK

(71) Applicant: Infineon Technologies AG, Neubiberg (DE)

(72) Inventor: Alexandre Valero, Aix-en-Provence (FR)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 17/164,503

(22) Filed: Feb. 1, 2021

(51) Int. Cl.
| H03K 17/12 | (2006.01) |
| H03K 17/14 | (2006.01) |
| H03K 17/18 | (2006.01) |
| G01R 29/10 | (2006.01) |
| G01R 31/26 | (2020.01) |
| G01R 31/28 | (2006.01) |
| H03K 17/687 | (2006.01) |
| H02J 4/00 | (2006.01) |
| H03K 5/24 | (2006.01) |
| H03F 3/45 | (2006.01) |

(52) U.S. Cl.
CPC ............ *H03K 17/6871* (2013.01); *H02J 4/00* (2013.01); *H03F 3/45475* (2013.01); *H03K 5/24* (2013.01); *H02J 2310/40* (2020.01)

(58) Field of Classification Search
None
See application file for complete search history.

(56) References Cited

U.S. PATENT DOCUMENTS

| 7,847,623 | B2 * | 12/2010 | L'Hostis | H03K 19/0013 327/541 |
| 8,823,411 | B2 * | 9/2014 | League | G01R 31/40 324/762.09 |
| 8,957,723 | B2 * | 2/2015 | Zoels | H03K 17/18 327/378 |
| 9,543,857 | B2 * | 1/2017 | Murata | H02M 7/5387 |
| 10,048,311 | B2 * | 8/2018 | Moll | H01L 29/0847 |
| 10,161,989 | B2 * | 12/2018 | Tavernier | H01L 27/0296 |
| 10,393,795 | B2 * | 8/2019 | Aeloiza | G01R 31/2621 |
| 10,788,525 | B2 * | 9/2020 | Hiura | G01R 31/2621 |
| 11,070,197 | B1 * | 7/2021 | Wang | H03M 1/12 |

* cited by examiner

*Primary Examiner* — Kenneth B Wells
(74) *Attorney, Agent, or Firm* — Cooper Legal Group, LLC

(57) ABSTRACT

A power switch fault detector detects faults in the current paths of power switches. A first operational amplifier detects a drain-source voltage of a first set of parallel connected field-effect transistors in a current path. A second operational amplifier detects a drain-source voltage of a second set of parallel connected field-effect transistors in the current path. A hardware or software processor is configured to compare a difference in magnitude of the drain-source voltages to a threshold voltage to determine whether a field-effect transistor of one of the first set or second set is compromised. The current path is isolated and one of the first set or second set of field-effect transistors is deactivated to determine whether a field-effect transistor of the first set or second set is stuck-open or shorted.

20 Claims, 13 Drawing Sheets

APPARATUS AND METHOD FOR POWER SWITCH STATUS CHECK

TECHNICAL FIELD

The present disclosure relates generally to fault detection circuitry.

BACKGROUND

Vehicles that provide driver assistance functions require a significant amount of onboard power to source onboard computers, sensors, actuators, motors, drivers, and many other electronic devices. Onboard power switches receive control signals to open and close conductive paths from power sources to the electronic devices. In this regard, the onboard power switches control the distribution of power to onboard devices on an as needed, operational, and/or functional basis.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

According to some embodiments, a method is provided. The method includes determining a drain-source voltage of a first set of parallel connected field-effect transistors in a first current path, and determining a drain-source voltage of a second set of parallel connected field-effect transistors in the first current path. The method includes determining a difference between the drain-source voltage of the first and of the second set of parallel connected field effect transistors. The method includes comparing the difference to a tolerance threshold. The method includes, responsive to the difference being greater than the tolerance threshold, determining that a field-effect transistor of the first set or of the second set of parallel connected field-effect transistors is compromised.

According to some embodiments, an apparatus is provided. The apparatus includes means for determining a drain-source voltage of a first set of parallel connected field-effect transistors in a first current path, and means for determining a drain-source voltage of a second set of parallel connected field-effect transistors in the first current path. The apparatus includes means for determining a difference between the drain-source voltage of the first and of the second set of parallel connected field effect transistors. The apparatus includes means for comparing the difference to a tolerance threshold. The apparatus includes means for, responsive to the difference being greater than the tolerance threshold, determining that a field-effect transistor of the first set or of the second set of parallel connected field-effect transistors is compromised.

According to some embodiments, an apparatus is provided. The apparatus includes a first set of parallel connected field-effect transistors in a current path. The apparatus includes a first differential amplifier having input terminals coupled to the first set of parallel connected field-effect transistors, and a first differential amplifier output terminal. The apparatus includes a second set of parallel connected field-effect transistors in the current path. The apparatus includes a second differential amplifier having input terminals coupled to the second set of parallel connected field-effect transistors, and a second differential amplifier output terminal. The apparatus includes a processor coupled to the first and second differential amplifier output terminals and configured to determine whether a field-effect transistor of the first or the second set of parallel connected field-effect transistors is compromised.

According to some embodiments, an apparatus is provided. The apparatus includes a power supply coupled to a first current path and a second current path in parallel with the first current path. The apparatus includes a first set of parallel connected field-effect transistors in the first current path. The apparatus includes a second set of parallel connected field-effect transistors in the first current path. The apparatus includes a first differential amplifier having input terminals coupled to the first set of parallel connected field-effect transistors, and a first differential amplifier output terminal. The apparatus includes a second differential amplifier having input terminals coupled to the second set of parallel connected field-effect transistors, and a second differential amplifier output terminal. The apparatus includes a processor coupled to the first and second differential amplifier output terminals and configured to deactivate the first current path and determine whether a field-effect transistor of the first or the second set of parallel connected field-effect transistors is shorted.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
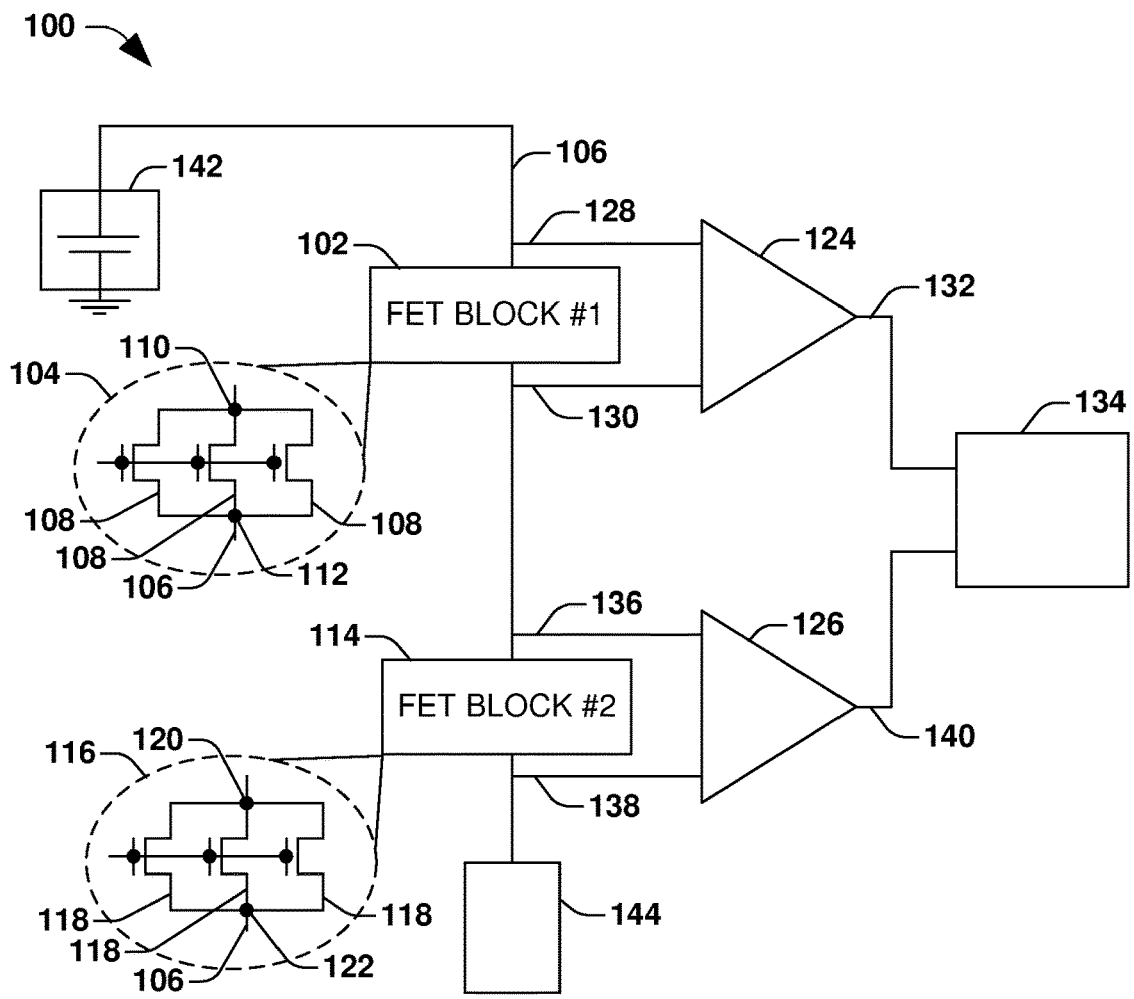
FIG. 1 is a schematic diagram of a power switch health check device, according to some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Reliability of battery and power network interconnections and switches is essential to enable advanced driver-assistance systems (ADAS) and automated driving (AD) systems. For example, the field-effect transistors (FETS) of power switches should be checked to detect faults such as shorted or stuck-open current paths. In many cases, ADAS and AD functions should be enabled only if all involved power switch FETS are fault-free. Thus, as provided herein, faults in current paths of power switch FETS are detected so that ADAS and AD devices are safely enabled or, in the event that a fault is detected, the associated devices are identified, bypassed, disabled, and/or an alert is activated in real time.

FIG. 1 is a schematic diagram of a power switch health check device 100, according to some embodiments. The power switch health check device 100 comprises a first field-effect transistor (FET) block 102 comprising a first set of parallel connected FETs 104 in a current path 106. The first set of parallel connected FETs 104 comprises FETs 108 coupled together in a parallel formation between a first node 110 and a second node 112 in the current path 106. The first node 110 is coupled to first regions of the FETs 108 and the second node 112 is coupled to second regions of the FETs 108. In some embodiments, the first regions of the FETs 108 are drain regions and the second regions of the FETs 108 are source regions. In some embodiments, the first regions of the FETs 108 are source regions and the second regions of the FETs 108 are drain regions.

The power switch health check device 100 comprises a second FET block 114 comprising a second set of parallel connected FETs 116 in the current path 106. The second set of parallel connected FETs 116 comprises FETs 118 coupled together in a parallel formation between a third node 120 and a fourth node 122 along the current path 106. The third node 120 is coupled to first regions of the FETs 118 and the second node 112 is coupled to second regions of the FETs 118. In some embodiments, the first regions of the FETs 118 are drain regions and the second regions of the FETs 118 are source regions. In some embodiments, the first regions of the FETs 118 are source regions and the second regions of the FETs 118 are drain regions. The drain regions of the FETs 118 may be coupled to drain regions of the FETs 108. The drain regions of the FETs 118 may be coupled to source regions of the FETs 108. The source regions of the FETs 118 may be coupled to drain regions of the FETs 108. The source regions of the FETs 118 may be coupled to source regions of the FETs 108. In some embodiments, the second node 112 is directly coupled to the third node 120 such that the first set of parallel connected FETs 104 is directly coupled to the second set of parallel connected FETs 116 in the current path 106.

The power switch health check device 100 comprises a first differential amplifier 124 and a second differential amplifier 126. The first differential amplifier 124 comprises a first input terminal 128 coupled to the first node 110, a second input terminal 130 coupled to the second node 112, and a first differential amplifier output terminal 132. The first differential amplifier output terminal 132 is coupled to a processor 134. The second differential amplifier 126 comprises a third input terminal 136 coupled to the third node 120, a fourth input terminal 138 coupled to the fourth node 122, and a second differential amplifier output terminal 140. The second differential amplifier output terminal 140 is coupled to the processor 134. The processor 134 may comprise discrete components, hardware, software, firmware, a computer, or other suitable devices.

According to some embodiments, the current path 106 is coupled to a supply domain source 142 and a supply domain load 144. The supply domain source 142 may be a power source such as a primary battery and the supply domain load 144 may be a motor, a sensor, a processor, an actuator, a direct-current-to-direct-current (DCDC) power supply, a secondary battery, or other suitable load.

Figure 2:
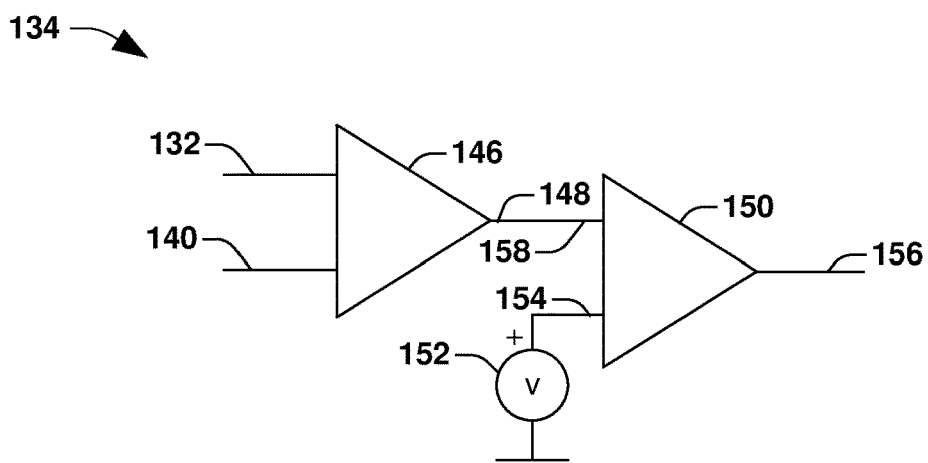
FIG. 2 illustrates an embodiment of a processor of a power switch health check device, according to some embodiments.

FIG. 2 illustrates an embodiment of the processor 134, according to some embodiments. The processor 134 comprises a third differential amplifier 146 coupled to the first differential amplifier output terminal 132 and the second differential amplifier output terminal 140. The third differential amplifier 146 comprises an output terminal 148 coupled to a first input terminal 158 of a comparator 150. A voltage source 152 of a reference voltage "v" is coupled to a second input terminal 154 of the comparator 150. The comparator 150 comprises an output terminal 156. A signal level at the output terminal 156 indicates whether a FET 108 of the first set of parallel connected FETs 104 or a FET 118 of the second set of parallel connected FETs 116 is compromised.

Thus, the power switch health check device 100 determines whether a FET of the first FET block 102 or a FET of the second FET block 114 is compromised. For example, if a FET 108 of the first FET block 102 is stuck-open, the total resistance of the first set of parallel connected FETs 104 increases to a resistance that is greater than the resistance of the second set of parallel connected FETs 116. As such, a first voltage at the first differential amplifier output terminal 132 is greater than a second voltage at the second differential amplifier output terminal 140. The difference is detected by the power switch health check device 100. If a signal at the output terminal 156 of the comparator 150 indicates that a difference between the first voltage and the second voltage is greater than the reference voltage "v", it can be concluded that a significant difference exists between the resistance of the first set of parallel connected FETs 104 and the resistance of the second set of parallel connected FETs 116. The greater magnitude among the output signal of first differential amplifier 124 and the output signal of the second differential amplifier 126 indicates which FET block of the first FET block 102 or the second FET block 114 has a stuck-open FET. If the output signal of the first differential amplifier 124 is greater than the output signal of the second differential amplifier 126, then the first FET block 102 includes a stuck-open FET. If the output signal of the second differential amplifier 126 is greater than the output signal of the first differential amplifier 124, then the second FET block 102 includes a stuck-open FET.

Figure 3:
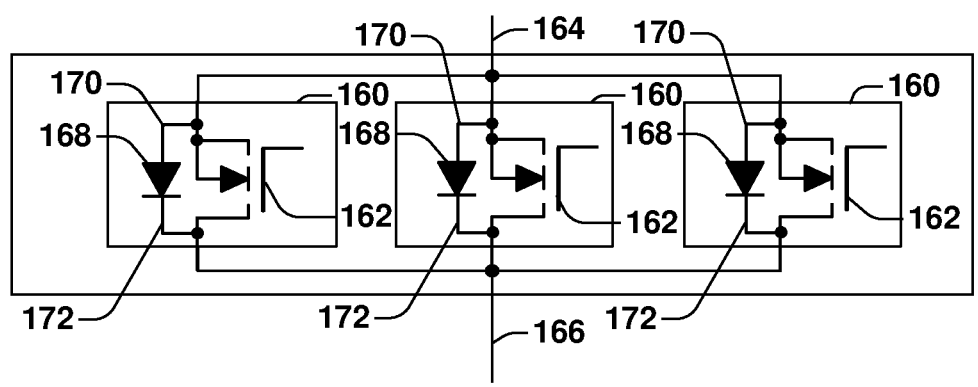
FIGS. 3-4 are schematic diagrams of field-effect transistor blocks, according to some embodiments.
Figure 4:
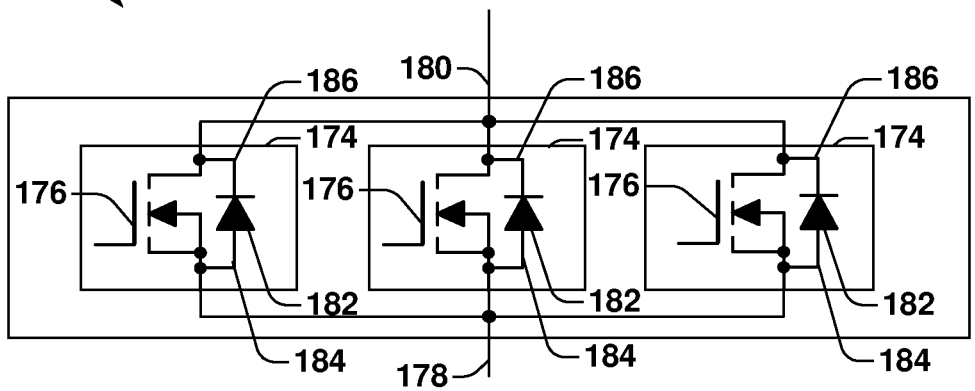

FIGS. 3-4 are schematic diagrams of field-effect transistor blocks 102/114, according to some embodiments.

Referring to FIG. 3, the field-effect transistor block 102/114 comprises three forward FETs 160. The forward FETs 160 each comprise a gate 162, a source terminal 164, a drain terminal 166, and an inherent body diode 168. An anode 170 of the body diode 168 is "coupled" to the source terminal 164 and a cathode 172 of the body diode 168 is "coupled" to the drain terminal 166.

Referring to FIG. 4, the field-effect transistor block 102/114 comprises three blocking FETs 174. The blocking FETs 174 each comprise a gate 176, a source terminal 178, a drain terminal 180, and an inherent body diode 182. An anode 184 of the body diode 182 is "coupled" to the source terminal 178 and a cathode 186 of the body diode 182 is "coupled" to the drain terminal 180.

In some embodiments, the first FET block 102 comprises three forward FETs 160 and the second FET block 114 comprises three blocking FETs 174 such that cathodes 172 of the forward FETs 160 are coupled to cathodes 186 of the blocking FETs 174. Other configurations of the first FET block 102 and the second FET block 114 are within the scope of the present disclosure.

Figure 5:
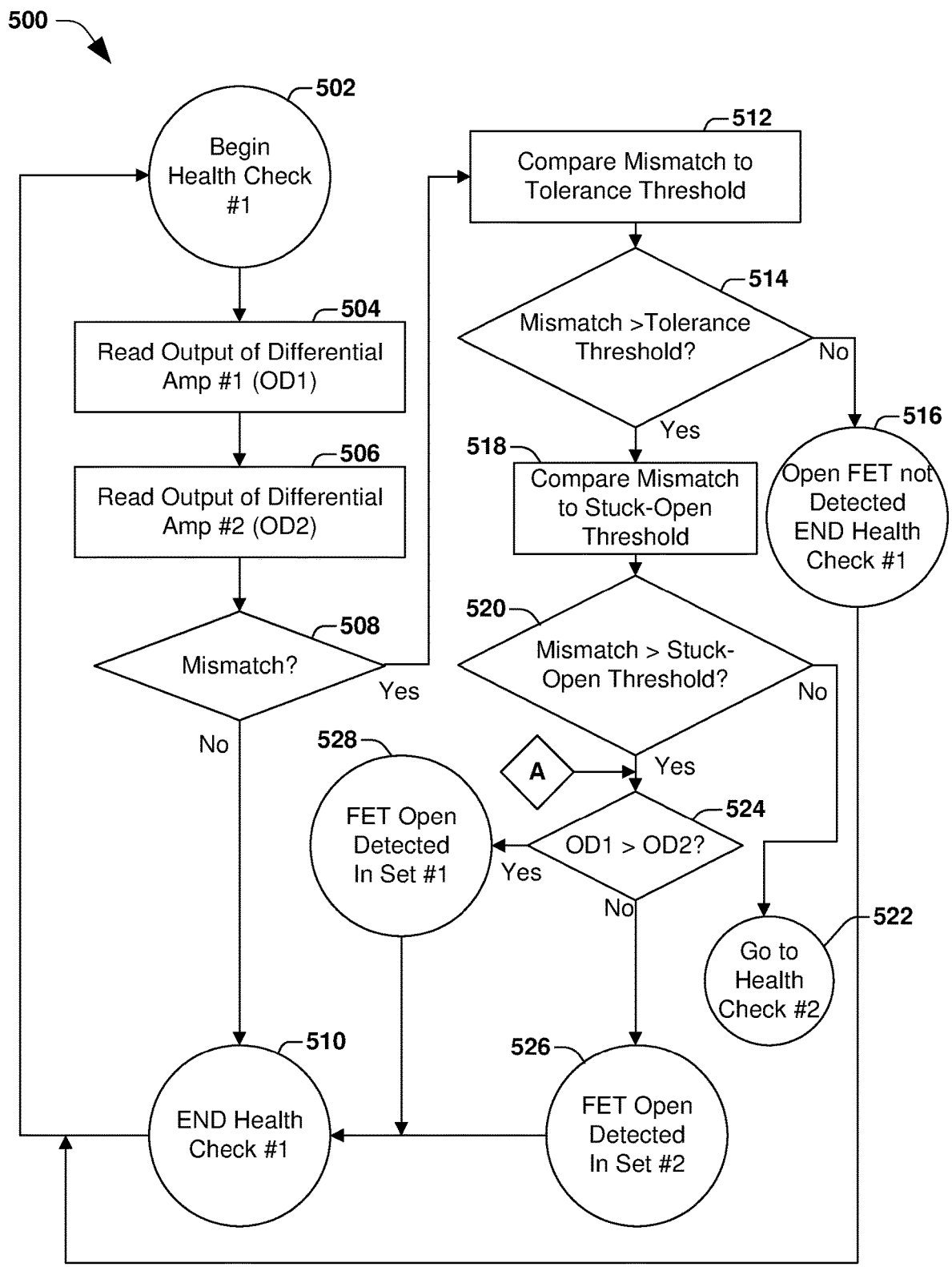
FIG. 5 illustrates a power switch health check method, according to some embodiments.

FIG. 5 illustrates a power switch health check method (500), according to some embodiments. The power switch health check method (500) is initiated at process block Begin Health Check #1 (502). An output (OD1) of a first differential amplifier is read (504). An output (OD2) of a second differential amplifier is read (506). The method includes determining whether there is a mismatch between OD1 and OD2 (508). If there is not a mismatch, Health Check #1 is terminated (510) and the power switch health check method (500) is initiated at process block Begin Health Check #1 (502). If there is a mismatch, the mismatch is compared to a tolerance threshold (512). If the mismatch is not greater than the tolerance threshold (514) "No", an open FET has not been detected, Health Check #1 is terminated (516), and the power switch health check method (500) is initiated at process block Begin Health Check #1 (502). If the mismatch is greater than the tolerance threshold (514) "Yes", then the mismatch is compared to a stuck-open threshold (518). If the mismatch is not greater than the stuck-open threshold (520) "No", the power switch health check method (500) proceeds to Health Check #2 (522) described below. If the mismatch is greater than the stuck-open threshold (520) "Yes", OD1 is compared to OD2 (524). If OD1 is greater than OD2 (524 "Yes") a stuck-open FET is in a first set of FETs (528), such as the first FET block 102. If OD1 is not greater than OD2 (524 "No") a stuck-open FET is in a second set of FETs (526), such as the second FET block 114. Regardless of whether OD1 is greater than OD2, Health Check #1 is terminated (510).

Figure 6:
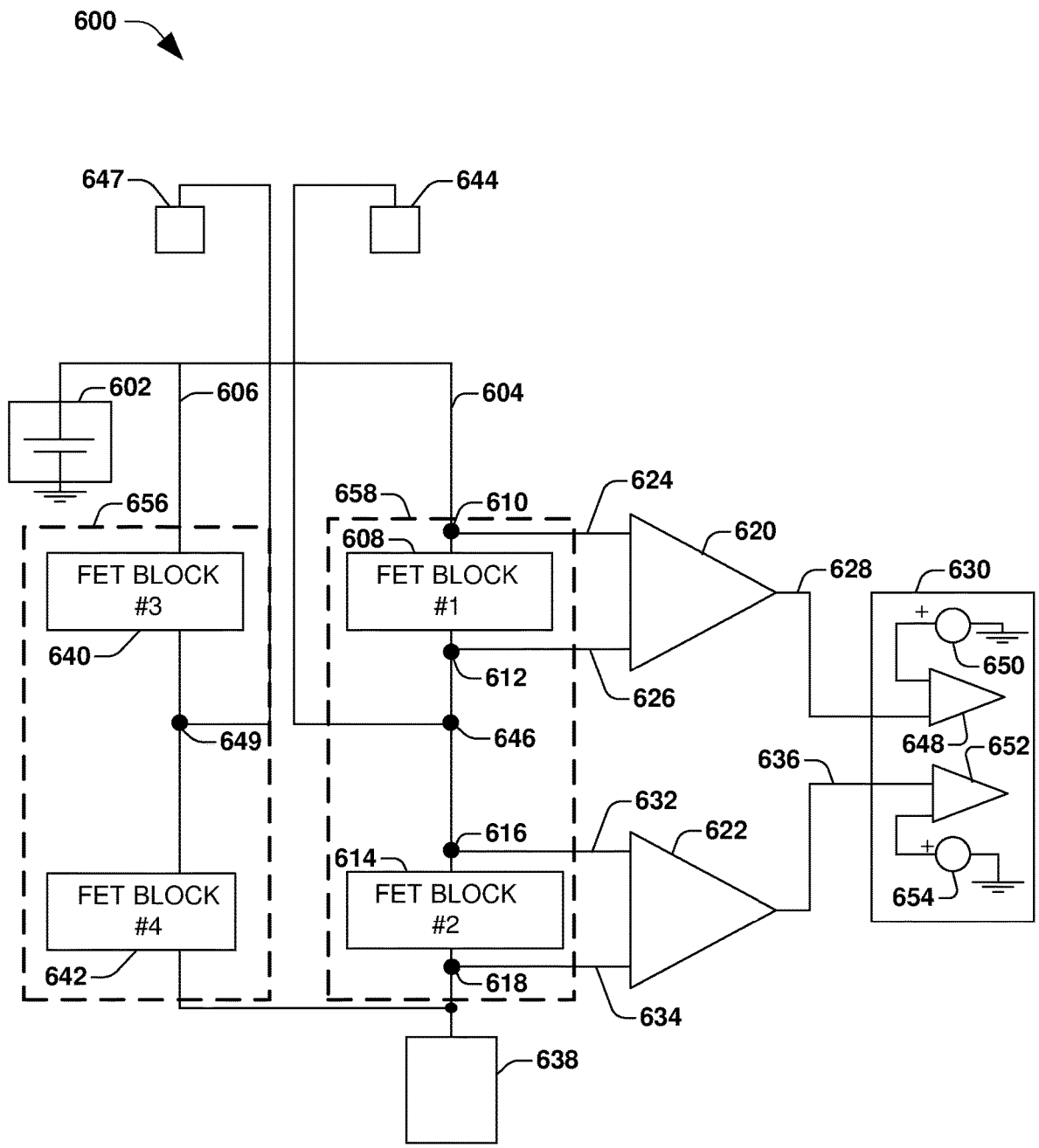
FIG. 6 is a schematic diagram of a power switch health check device, according to some embodiments.

FIG. 6 is a schematic diagram of a power switch health check device 600, according to some embodiments.

The power switch health check device 600 comprises a supply domain source 602 coupled to a first current path 604 and a second current path 606 in parallel with the first current path 604. The power switch health check device 600 comprises a first field-effect transistor (FET) block 608 comprising a first set of parallel connected FETs in the current path 604. The first set of parallel connected FETs comprises FETs coupled together in a parallel formation between a first node 610 and a second node 612 in the current path 604. The first node 610 is coupled to first regions of the FETs and the second node 612 is coupled to second regions of the FETs. In some embodiments, the first regions of the FETs are drain regions and the second regions of the FETs are source regions. In some embodiments, the first regions of the FETs are source regions and the second regions of the FETs are drain regions.

The power switch health check device 100 comprises a second FET block 614 comprising a second set of parallel connected FETs in the current path 106. The second set of parallel connected FETs comprises FETs coupled together in a parallel formation between a third node 616 and a fourth node 618 along the current path 604. The third node 616 is coupled to first regions of the FETs and the fourth node 618 is coupled to second regions of the FETs. In some embodiments, the first regions of the FETs are drain regions and the second regions of the FETs are source regions. In some embodiments, the first regions of the FETs are source regions and the second regions of the FETs are drain regions.

The drain regions of the FETs in the first FET block 608 may be coupled to drain regions of the FETs in the second FET block 614. The drain regions of the FETs in the first FET block 608 may be coupled to source regions of the FETs in the second FET block 614. The source regions of the FETs in the first FET block 608 may be coupled to drain regions of the FETs in the second FET block 614. The source regions of the FETs in the first FET block 608 may be coupled to source regions of the FETs in the second FET block 614. In some embodiments, the second node 612 is directly coupled to the third node 616 such that the first set of parallel connected FETs in the first FET block 608 is directly coupled to the second set of parallel connected FETs in the second FET block 614.

The power switch health check device 600 comprises a first differential amplifier 620 and a second differential amplifier 622. The first differential amplifier 620 comprises a first input terminal 624 coupled to the first node 610, a second input terminal 626 coupled to the second node 612, and a first differential amplifier output terminal 628. The first differential amplifier output terminal 628 is coupled to a processor 630. The second differential amplifier 622 comprises a third input terminal 632 coupled to the third node 616, a fourth input terminal 634 coupled to the fourth node 618, and a second differential amplifier output terminal 636. The second differential amplifier output terminal 636 is coupled to the processor 630. The processor 630 may comprise discrete components, hardware, software, firmware, a computer, or other suitable devices. According to some embodiments, the processor 630 is configured to deactivate the first current path 604 and determine whether a FET of the first FET block 608 or of the second FET block 614 is shorted. The processor 630 may be configured to switch on and maintain on the FETs of the first FET block 608 or FETs of the second FET block 614 while the first current path 604 is maintained in a deactivated state. The power switch health check device 600 comprises a first comparator 648 comprising input terminals coupled to the first differential amplifier output terminal 628 and to a terminal of a first reference voltage 650 and a second comparator 652 comprising input terminals coupled to the second differential amplifier output terminal 636 and to a terminal of a second reference voltage 654. In some embodiments, the first reference voltage 650 and the second reference voltage 654 are threshold voltage of a body diode.

According to some embodiments, the current path 604 is coupled to a supply domain load/source 638. The supply domain source 602 may be a power source such as a primary battery and the supply domain load/source 638 may be a motor, a sensor, a processor, an actuator, a direct-current-to-direct-current (DCDC) power supply, a secondary battery, or other suitable load/source.

The power switch health check device 100 comprises a third FET block 640 comprising a third set of parallel connected FETs in the second current path 606 and a fourth FET block 642 comprising a fourth set of parallel connected FETs in the second current path 606. A first switch cell 656 comprises the third FET block 640 and the fourth FET block 642, and a second switch cell 658 comprises the first FET block 608 and the second FET block 614. According to some embodiments, a first current or voltage source 644 is coupled to a fifth node 646 in the first current path 604 between the first FET block 608 and the second FET block 614 and a second current or voltage source 647 is coupled to a first node 649 in the second current path 606 between the third FET block 640 and the fourth FET block 642.

Figure 7A:
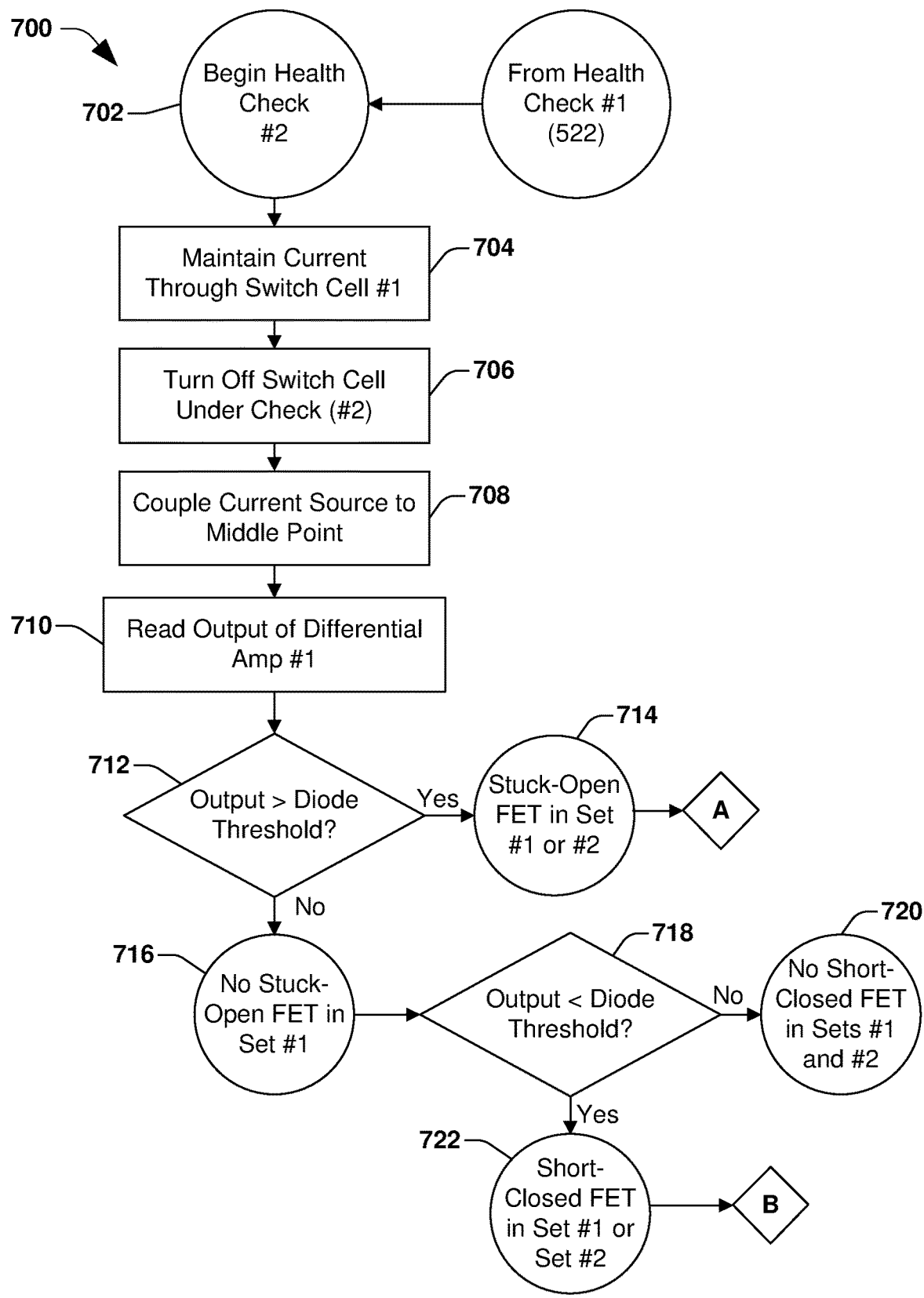
FIGS. 7A-7F illustrate a power switch health check method, according to some embodiments.
Figure 7B:
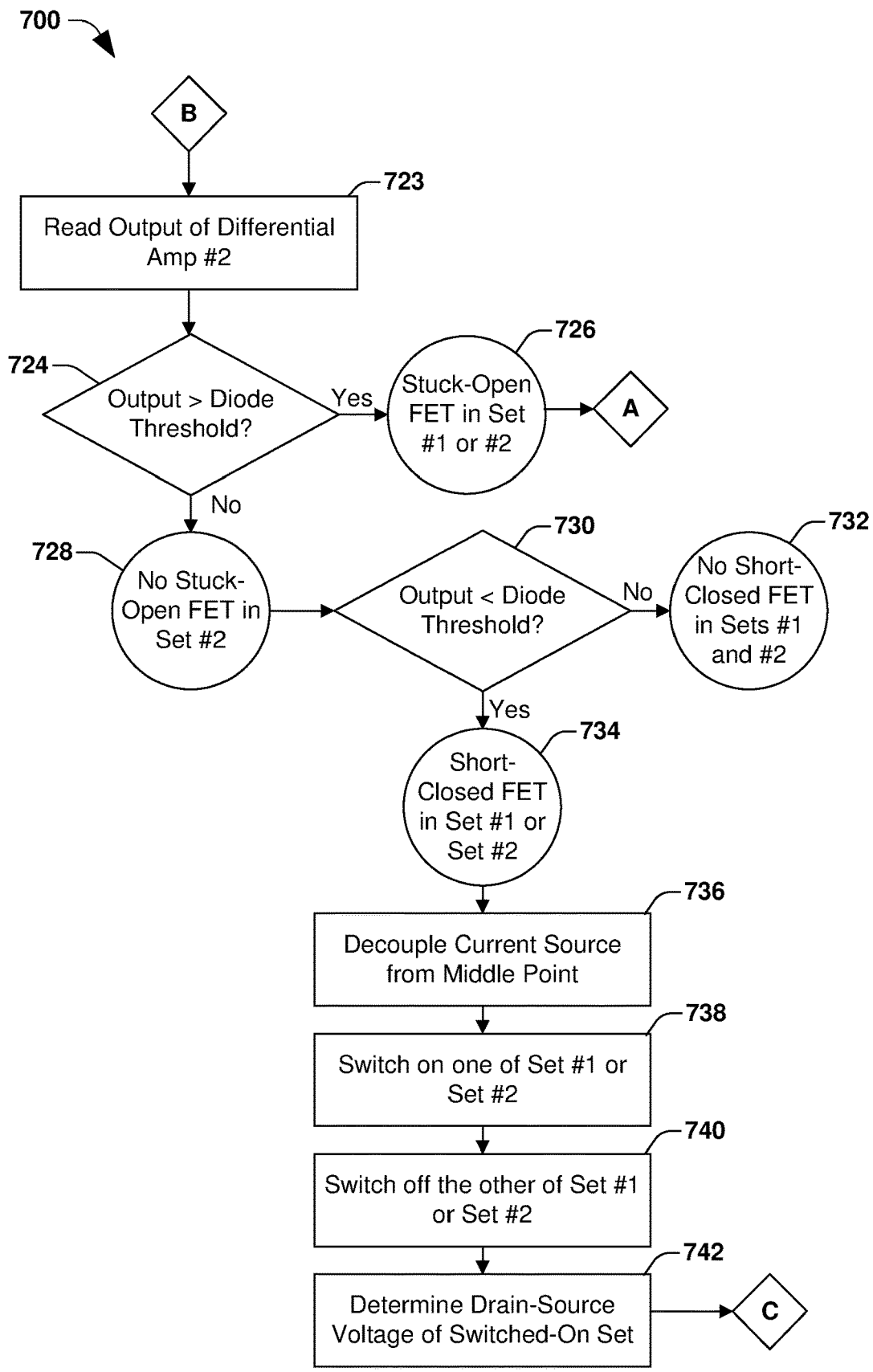
Figure 7C:
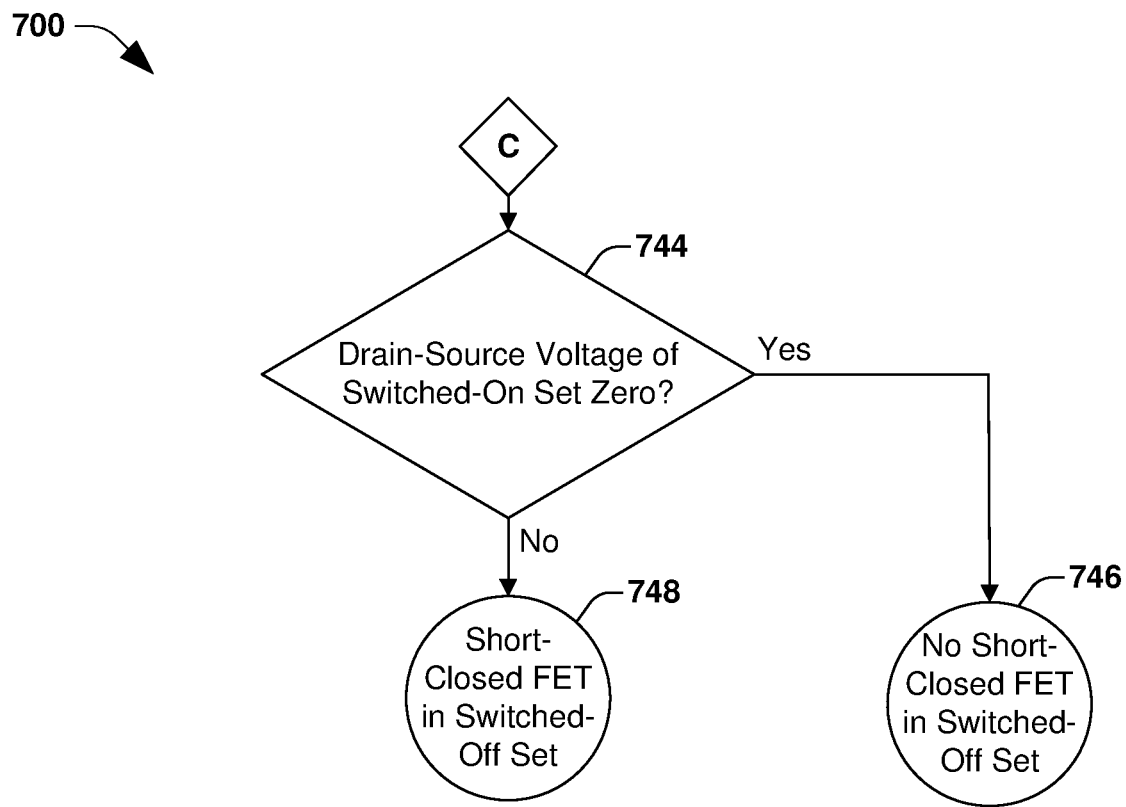

FIGS. 7A-7C illustrate a power switch health check method, according to some embodiments. The power switch health check method (700) is initiated from Health Check #1 (522) and the method begins at Begin Health Check #2 (702). Current is maintained through switch cell #1 (704). The switch cell under check is turned off (706). A current source is coupled to a node between Set #1 and Set #2 (708). The output of the first differential amplifier is read (710). The method includes determining whether the output of the first differential amplifier is greater than a diode threshold (712). If the output is greater than a diode threshold, a FET in Set #1 or Set #2 is stuck-open (714) and the method continues to "524" of FIG. 5. If the output is not greater than a diode threshold, then no FETs in Set #1 are stuck-open (716). The method includes determining whether the output of the first differential amplifier is less than a diode threshold (718). If the output is not less than the diode threshold, there is not a short-closed FET in both of Set #1 and Set #2 (720). If the output is less than the diode threshold, there is a short-closed FET in one of Set #1 or Set #2 (722).

The method includes reading the output of differential amplifier #2 (723) and determining whether the output is greater than a diode threshold (724). If the output is greater than a diode threshold, a FET in Set #1 or Set #2 is stuck-open (726) and the method continues to "524" of FIG. 5. If the output is not greater than a diode threshold, then no FETs in Set #2 are stuck-open (728). The method includes determining whether the output of the second differential amplifier is less than a diode threshold (730). If the output is not less than the diode threshold, there is not a short-closed FET in both of Set #1 and Set #2 (732). If the output is less than the diode threshold, there is a short-closed FET in one of Set #1 or Set #2 (734). The current source is decoupled from the node between Set #1 and Set #2 (736). One of Set #1 or Set #2 is switched on (738) and the other of Set #1 or Set #2 is switched off (740). The drain-source voltage of the switched-on set is determined (742). If the drain-source voltage of the switched-on set is zero (744), there is not a short-closed FET in the switched-off set (746). If the drain-source voltage of the switched-on set is not zero, there is a short-closed FET in the switched-off set (748).

Figure 7D:
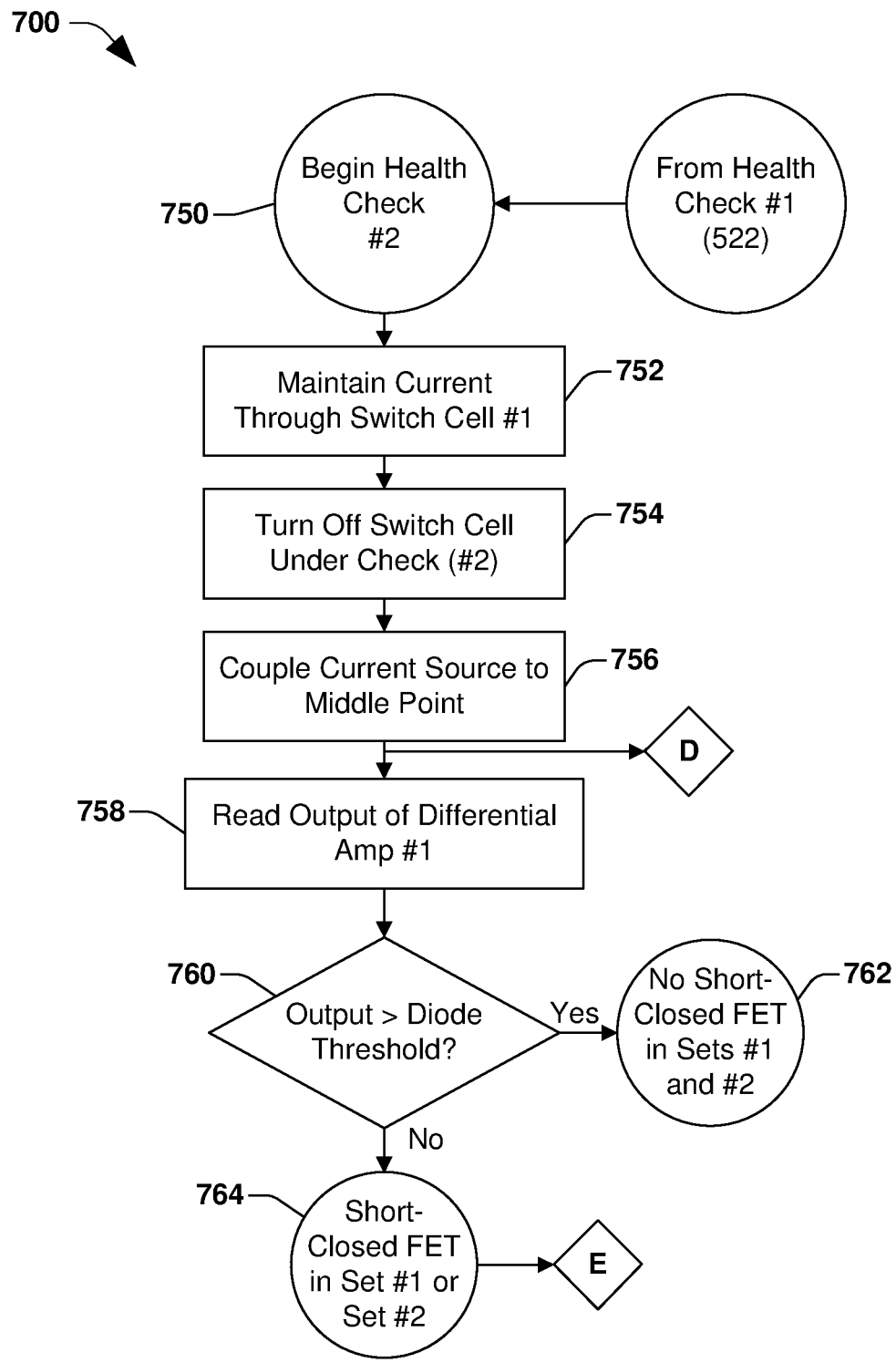
Figure 7E:
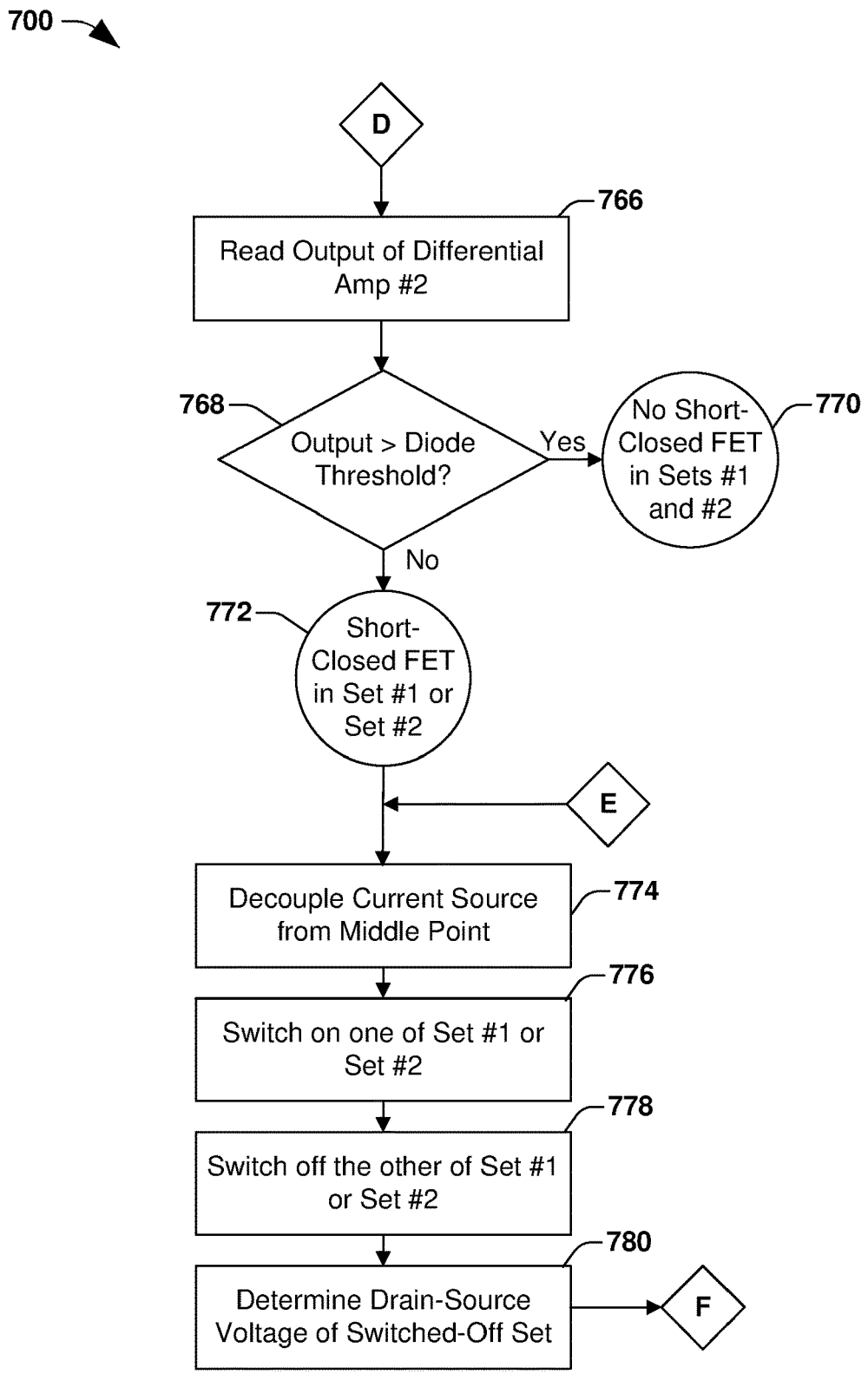
Figure 7F:
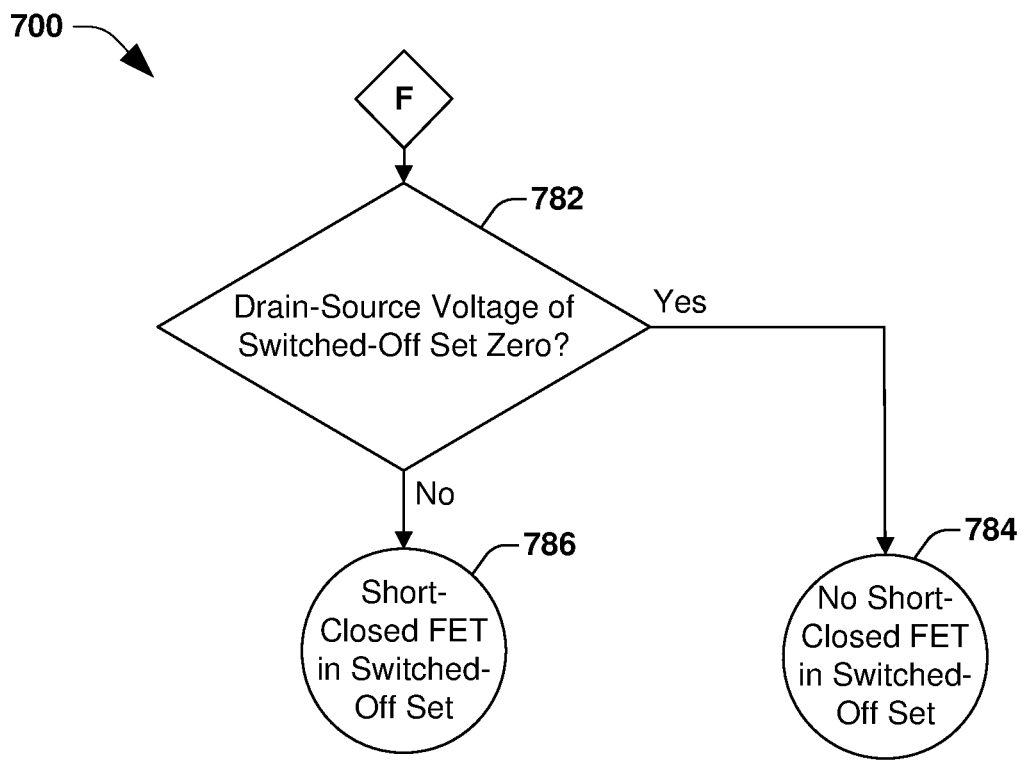

FIGS. 7D-7F illustrate a power switch health check method, according to some embodiments. The power switch health check method (700) is initiated from Health Check #1 (522) and the method begins at Begin Health Check #2 (750). Current is maintained through switch cell #1 (752). The switch cell under check is turned off (754). A current source is coupled to a node between Set #1 and Set #2 (756). The method includes proceeding in parallel to (766), discussed below, and reading the output of the first differential amplifier (758). The method includes determining whether the output of the first differential amplifier is greater than a diode threshold (760). If the output is greater than a diode threshold, there is not a short-closed FET in both of Set #1 and Set #1 (762). If the output is not greater than a diode threshold, there is a short-closed FET in one of Set #1 or Set #2 and the method continues to (774), discussed below.

In parallel with reading the output of the first differential amplifier (758), the output of the second differential amplifier is read (766). The method includes determining whether the output is greater than a diode threshold (768). If the output is greater than a diode threshold, there is not a short-closed FET in both of Set #1 and Set #2 (770). If the output is not greater than a diode threshold, there is a short-closed FET in one of Set #1 or Set #2 (772). The current source is decoupled from the node between Set #1 and Set #2 (774). One of Set #1 or Set #2 is switched on (776) and the other of Set #1 or Set #2 is switched off (778). The drain-source voltage of the switched-off set is determined (780). The method includes determining whether the drain-source voltage is zero (782). If the drain-source voltage of the switched-off set is zero, there is not a short-closed FET in the switched-off set (784). If the drain-source voltage of the switched-off set is not zero, there is a short-closed FET in the switched-off set (786).

Figure 8:
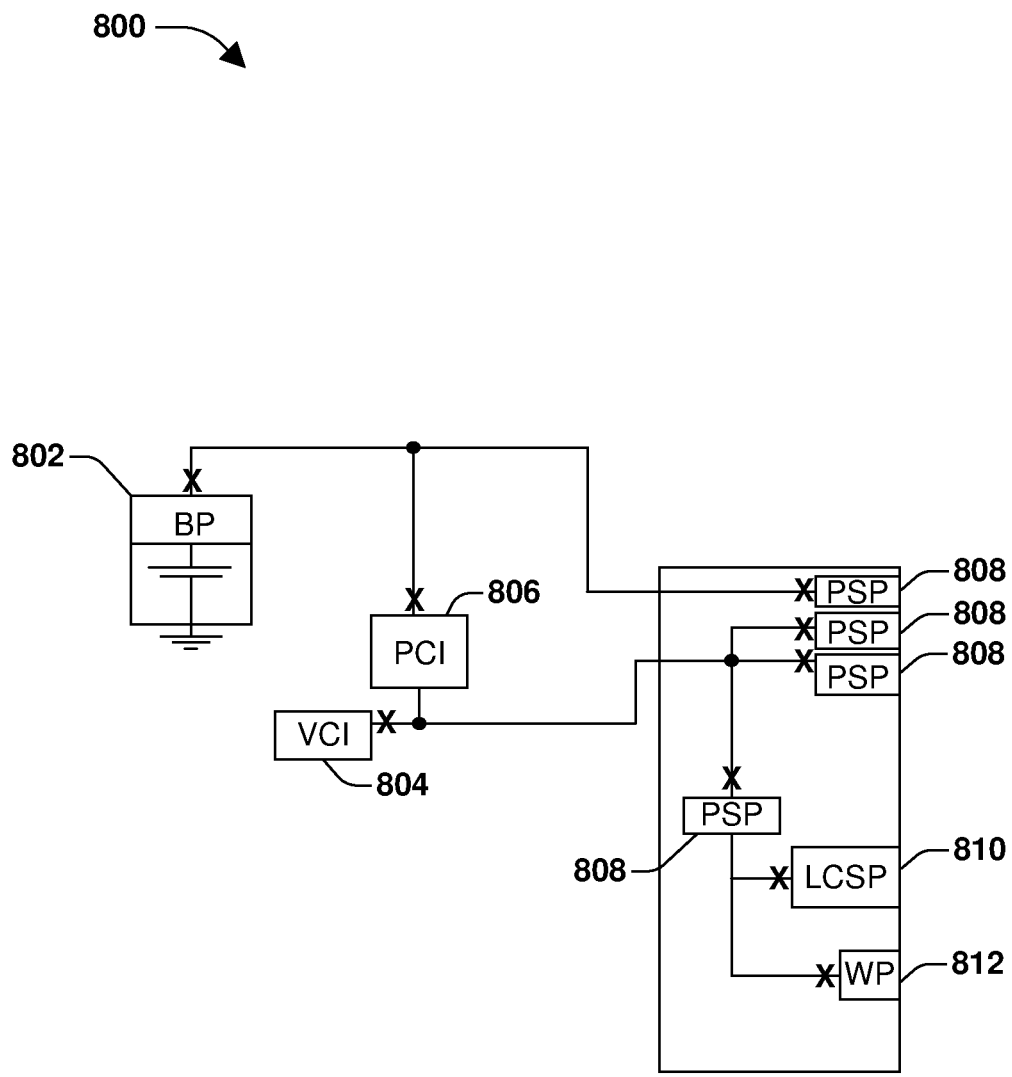
FIG. 8 illustrates a power network system, according to some embodiments.

FIG. 8 illustrates a power network system 800, according to some embodiments. Locations of power switch health check devices 100 within the power network system 800 are designated by the symbol "X". In some embodiments, power switch health check devices 100 are coupled to batteries 802, voltage conversion and isolation devices 804, power supply connection and isolation devices 806, load protectors 808, load control and self-protection devices 810, wire protection devices 812, and other suitable devices.

Figure 9:
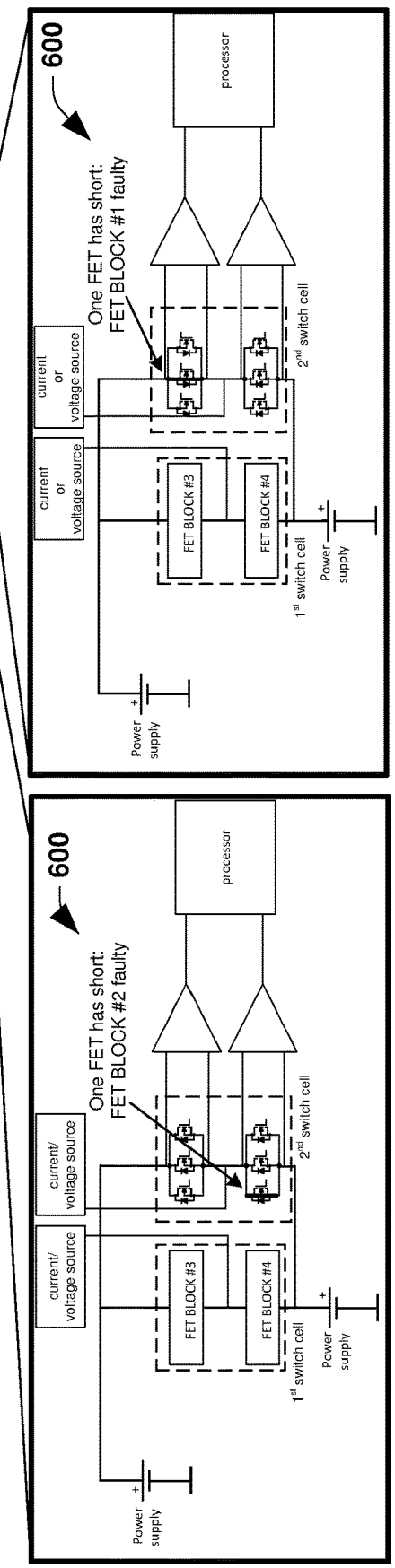
FIG. 9 is a table that illustrates field-effect transistor block status' for forward and blocking field-effect transistor block combinations, according to some embodiments.

FIG. 9 is a table that illustrates field-effect transistor block status' for forward and blocking field-effect transistor block combinations, according to some embodiments.

Figure 10:
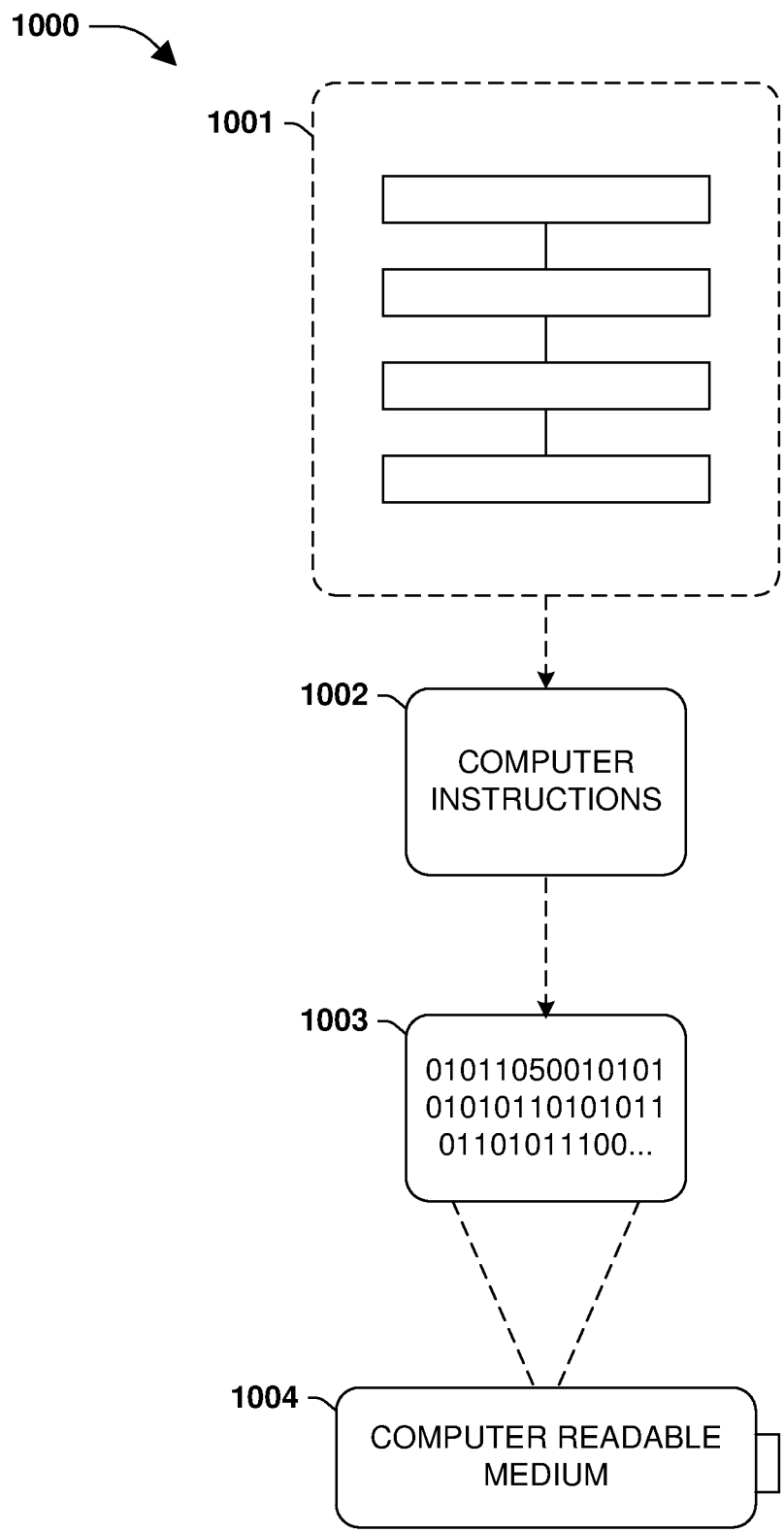
FIG. 10 illustrates an exemplary computer-readable medium, according to some embodiments.

FIG. 10 illustrates an exemplary computer-readable medium, according to some embodiments. One or more embodiments involve a computer-readable medium comprising processor-executable instructions configured to implement one or more of the techniques presented herein. An exemplary computer-readable medium is illustrated in FIG. 10, wherein the embodiment 1000 comprises a computer-readable medium 1004 (e.g., a CD-R, DVD-R, flash drive, a platter of a hard disk drive, etc.), on which is encoded computer-readable data 1003. This computer-readable data 1003 in turn comprises a set of processor-executable computer instructions 1002 that when executed are configured to facilitate operations according to one or more of the principles set forth herein. In some embodiments 1000, the processor-executable computer instructions 1002, when executed, are configured to facilitate performance of a method 1001, such as at least some of the aforementioned method(s). In some embodiments, the processor-executable computer instructions 1002, when executed, are configured to facilitate implementation of a system, such as at least some of the one or more aforementioned system(s). Many such computer-readable media may be devised by those of ordinary skill in the art that are configured to operate in accordance with the techniques presented herein.

The term "computer readable media" may include communication media. Communication media typically embodies computer readable instructions or other data in a "modulated data signal" such as a carrier wafer or other transport mechanism and includes any information delivery media. The term "modulated data signal" may include a signal that has one or more of its characteristics set or changed in such a manner as to encode information in the signal.

A power switch health check device 100 monitors the voltage drop across at least two sets of power switches on the same current path. The voltage drops are compared to one another in real time to detect whether one of the sets of power switches is compromised, such as having a stuck-open or short-closed FET. Because the at least two sets of power switches are on the same current path, the power switches are monitored independent of temperature and current flow. Redundant power switches on a second current path, parallel to the current path under test, allow systems to keep operating while power switches are tested.

According to some embodiments, a method is provided. The method comprises determining a drain-source voltage of a first set of parallel connected field-effect transistors in a first current path; determining a drain-source voltage of a second set of parallel connected field-effect transistors in the first current path; determining a difference between the drain-source voltage of the first and of the second set of parallel connected field effect transistors; comparing the difference to a tolerance threshold; and responsive to the difference being greater than the tolerance threshold, determining that a field-effect transistor of the first set or of the second set of parallel connected field-effect transistors is compromised.

According to some embodiments, the method comprises comparing the difference to a stuck-open threshold greater than the tolerance threshold; and responsive to the difference being greater than the stuck-open threshold, determining that a set of parallel connected field-effect transistors having a greatest drain-source voltage has a compromised transistor as a stuck-open transistor.

According to some embodiments, the method comprises comparing the difference to a stuck-open threshold greater than the tolerance threshold; and responsive to the difference being less than the stuck-open threshold, maintaining current in a second current path parallel to the first current path, wherein a third set of parallel connected field-effect transistors and a fourth set of parallel connected field-effect transistors are in the second current path.

According to some embodiments, the method comprises responsive to the difference being less than the stuck-open threshold, deactivating the first current path; coupling a current source to a node in the first current path between the first set of parallel connected field-effect transistors and the second set of parallel connected field-effect transistors; determining a drain-source voltage of the first set of parallel connected field-effect transistors; determining a drain-source voltage of the second set of parallel connected field-effect transistors; responsive to the drain-source voltage of the first set of parallel connected field-effect transistors being greater than a diode threshold, determining that neither the first set nor the second set includes a short-closed field-effect transistor; and responsive to the drain-source voltage of the second set of parallel connected field-effect transistors being greater than the diode threshold, determining that neither the first set nor the second set includes a short-closed field-effect transistor.

According to some embodiments, the method comprises responsive to the difference being less than the stuck-open threshold, deactivating the first current path; coupling a current source to a node in the first current path between the first set of parallel connected field-effect transistors and the second set of parallel connected field-effect transistors; determining a drain-source voltage of the first set of parallel connected field-effect transistors; determining a drain-source voltage of the second set of parallel connected field-effect transistors; responsive to determining that the drain-source voltage of the first set or of the second set is less than a diode threshold, determining that a field-effect transistor of the first set or the second set of parallel connected field-effect transistors is shorted; decoupling the current source from the node; switching on one of the first set or the second set of parallel connected field-effect transistors, and switching off the other of the first set or the second set of parallel connected field-effect transistors; determining a drain-source voltage of the switched-off set; and responsive to determining that the drain-source voltage of the switched-off set is approximately zero, determining that the switched-off set of parallel connected field-effect transistors contains no shorted field effect transistors.

According to some embodiments, the method comprises responsive to the difference being less than the stuck-open threshold, deactivating the first current path; coupling a current source to a node in the first current path between the first set of parallel connected field-effect transistors and the second set of parallel connected field-effect transistors; determining a drain-source voltage of the first set of parallel connected field-effect transistors; determining a drain-source voltage of the second set of parallel connected field-effect transistors; responsive to determining that the drain-source voltage of the first set or of the second set is less than a diode threshold, determining that a field-effect transistor of the first set or the second set of parallel connected field-effect transistors is shorted; decoupling the current source from the node; switching on one of the first set or the second set of parallel connected field-effect transistors, and switching off the other of the first set or the second set of parallel connected field-effect transistors; determining a drain-source voltage of the switched-off set; and responsive to determining that the drain-source voltage of the switched-off set is greater than zero, determining that a field-effect transistor of the switched-off set of parallel connected field-effect transistors is shorted.

According to some embodiments, an apparatus is provided. The apparatus comprises a first set of parallel connected field-effect transistors in a current path; a first differential amplifier comprising: input terminals coupled to the first set of parallel connected field-effect transistors; and a first differential amplifier output terminal; a second set of parallel connected field-effect transistors in the current path; a second differential amplifier comprising: input terminals coupled to the second set of parallel connected field-effect transistors; and a second differential amplifier output terminal; and a processor coupled to the first and second differential amplifier output terminals and configured to determine whether a field-effect transistor of the first or the second set of parallel connected field-effect transistors is compromised.

According to some embodiments, the processor comprises: a third differential amplifier comprising: input terminals coupled to the first and second differential amplifier output terminals; and a third differential amplifier output terminal; and a comparator comprising: a first input terminal coupled to the third differential amplifier output terminal; a second input terminal coupled to a terminal of a reference voltage; and a comparator output terminal, wherein a signal level at the comparator output terminal indicates whether a field-effect transistor of the first set or the second set of parallel connected field-effect transistors is compromised.

According to some embodiments, the apparatus comprises a supply domain source coupled to the current path and the first set of parallel connected field-effect transistors; and a supply domain load coupled to the current path and the second set of parallel connected field-effect transistors.

According to some embodiments, the supply domain load is a direct-current-to-direct-current (DCDC) power supply.

According to some embodiments, the first set of parallel connected field-effect transistors is directly coupled to the second set of parallel connected field-effect transistors in the current path.

According to some embodiments, drain terminals of transistors of the first set of parallel connected field-effect transistors are directly coupled to drain terminals of transistors of the second set of parallel connected field-effect transistors.

According to some embodiments, transistors of the first set of parallel connected field-effect transistors comprise forward diodes in the current path, transistors of the second set of parallel connected field-effect transistors comprise blocking diodes in the current path, and cathodes of the forward diodes are coupled to cathodes of the blocking diodes.

According to some embodiments, an apparatus is provided. The apparatus comprises a power supply coupled to a first current path and a second current path in parallel with the first current path; a first set of parallel connected field-effect transistors in the first current path; a second set of parallel connected field-effect transistors in the first current path; a first differential amplifier comprising: input terminals coupled to the first set of parallel connected field-effect transistors; and a first differential amplifier output terminal; a second differential amplifier comprising: input terminals coupled to the second set of parallel connected field-effect transistors; and a second differential amplifier output terminal; and a processor coupled to the first and second differential amplifier output terminals and configured to deactivate the first current path and determine whether a field-effect transistor of the first or the second set of parallel connected field-effect transistors is shorted.

According to some embodiments, the processor is configured to switch on and maintain on the first or second set of parallel connected field-effect transistors while the first current path is maintained in a deactivated state.

According to some embodiments, a third set of parallel connected field-effect transistors and a fourth set of parallel connected field-effect transistors in series in the second current path.

According to some embodiments, the apparatus comprises a current source coupled to a node in the first current path between the first set of parallel connected field-effect transistors and the second set of parallel connected field-effect transistors.

According to some embodiments, the apparatus comprises a first comparator comprising input terminals coupled to the first differential amplifier output terminal and to a terminal of a first reference voltage; and a second comparator comprising input terminals coupled to the second differential amplifier output terminal and to a terminal of a second reference voltage.

According to some embodiments, the first and second reference voltages are threshold voltages of a diode.

According to some embodiments, transistors of the first set of parallel connected field-effect transistors comprise forward diodes in the first current path, transistors of the second set of parallel connected field-effect transistors comprise blocking diodes in the first current path, and cathodes of the forward diodes are coupled to cathodes of the blocking diodes.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method, comprising:
   determining a drain-source voltage of a first set of parallel connected field-effect transistors in a first current path;
   determining a drain-source voltage of a second set of parallel connected field-effect transistors in the first current path;
   determining a difference between the drain-source voltage of the first and of the second set of parallel connected field effect transistors;
   comparing the difference to a tolerance threshold; and
   responsive to the difference being greater than the tolerance threshold, determining that a field-effect transistor of the first set or of the second set of parallel connected field-effect transistors is compromised.

2. The method of claim 1, comprising:
   comparing the difference to a stuck-open threshold greater than the tolerance threshold; and
   responsive to the difference being greater than the stuck-open threshold, determining that a set of parallel connected field-effect transistors having a greatest drain-source voltage has a compromised transistor as a stuck-open transistor.

3. The method of claim 1, comprising:
   comparing the difference to a stuck-open threshold greater than the tolerance threshold; and
   responsive to the difference being less than the stuck-open threshold, maintaining current in a second current path parallel to the first current path, wherein a third set of parallel connected field-effect transistors and a fourth set of parallel connected field-effect transistors are in the second current path.

4. The method of claim 3, comprising:
responsive to the difference being less than the stuck-open threshold, deactivating the first current path;
coupling a current source to a node in the first current path between the first set of parallel connected field-effect transistors and the second set of parallel connected field-effect transistors;
determining a drain-source voltage of the first set of parallel connected field-effect transistors;
determining a drain-source voltage of the second set of parallel connected field-effect transistors;
responsive to the drain-source voltage of the first set of parallel connected field-effect transistors being greater than a diode threshold, determining that neither the first set nor the second set includes a short-closed field-effect transistor; and
responsive to the drain-source voltage of the second set of parallel connected field-effect transistors being greater than the diode threshold, determining that neither the first set nor the second set includes a short-closed field-effect transistor.

5. The method of claim 3, comprising:
responsive to the difference being less than the stuck-open threshold, deactivating the first current path;
coupling a current source to a node in the first current path between the first set of parallel connected field-effect transistors and the second set of parallel connected field-effect transistors;
determining a drain-source voltage of the first set of parallel connected field-effect transistors;
determining a drain-source voltage of the second set of parallel connected field-effect transistors;
responsive to determining that the drain-source voltage of the first set or of the second set is less than a diode threshold, determining that a field-effect transistor of the first set or the second set of parallel connected field-effect transistors is shorted;
decoupling the current source from the node;
switching on one of the first set or the second set of parallel connected field-effect transistors, and switching off the other of the first set or the second set of parallel connected field-effect transistors;
determining a drain-source voltage of the switched-off set; and
responsive to determining that the drain-source voltage of the switched-off set is approximately zero, determining that the switched-off set of parallel connected field-effect transistors contains no shorted field effect transistors.

6. The method of claim 3, comprising:
responsive to the difference being less than the stuck-open threshold, deactivating the first current path;
coupling a current source to a node in the first current path between the first set of parallel connected field-effect transistors and the second set of parallel connected field-effect transistors;
determining a drain-source voltage of the first set of parallel connected field-effect transistors;
determining a drain-source voltage of the second set of parallel connected field-effect transistors;
responsive to determining that the drain-source voltage of the first set or of the second set is less than a diode threshold, determining that a field-effect transistor of the first set or the second set of parallel connected field-effect transistors is shorted;
decoupling the current source from the node;
switching on one of the first set or the second set of parallel connected field-effect transistors, and switching off the other of the first set or the second set of parallel connected field-effect transistors;
determining a drain-source voltage of the switched-off set; and
responsive to determining that the drain-source voltage of the switched-off set is greater than zero, determining that a field-effect transistor of the switched-off set of parallel connected field-effect transistors is shorted.

7. An apparatus, comprising:
a first set of parallel connected field-effect transistors in a current path;
a first differential amplifier comprising:
input terminals coupled to the first set of parallel connected field-effect transistors; and
a first differential amplifier output terminal;
a second set of parallel connected field-effect transistors in the current path;
a second differential amplifier comprising:
input terminals coupled to the second set of parallel connected field-effect transistors; and
a second differential amplifier output terminal; and
a processor coupled to the first and second differential amplifier output terminals and configured to determine whether a field-effect transistor of the first or the second set of parallel connected field-effect transistors is compromised.

8. The apparatus of claim 7, wherein the processor comprises:
a third differential amplifier comprising:
input terminals coupled to the first and second differential amplifier output terminals; and
a third differential amplifier output terminal; and
a comparator comprising:
a first input terminal coupled to the third differential amplifier output terminal;
a second input terminal coupled to a terminal of a reference voltage; and
a comparator output terminal,
wherein a signal level at the comparator output terminal indicates whether a field-effect transistor of the first set or the second set of parallel connected field-effect transistors is compromised.

9. The apparatus of claim 7, comprising:
a supply domain source coupled to the current path and the first set of parallel connected field-effect transistors; and
a supply domain load coupled to the current path and the second set of parallel connected field-effect transistors.

10. The apparatus of claim 9, wherein the supply domain load is a direct-current-to-direct-current (DCDC) power supply.

11. The apparatus of claim 7, wherein the first set of parallel connected field-effect transistors is directly coupled to the second set of parallel connected field-effect transistors in the current path.

12. The apparatus of claim 7, wherein drain terminals of transistors of the first set of parallel connected field-effect transistors are directly coupled to drain terminals of transistors of the second set of parallel connected field-effect transistors.

13. The apparatus of claim 7, wherein
transistors of the first set of parallel connected field-effect transistors comprise forward diodes in the current path,
transistors of the second set of parallel connected field-effect transistors comprise blocking diodes in the current path, and
cathodes of the forward diodes are coupled to cathodes of the blocking diodes.

14. An apparatus, comprising:
a power supply coupled to a first current path and a second current path in parallel with the first current path;
a first set of parallel connected field-effect transistors in the first current path;
a second set of parallel connected field-effect transistors in the first current path;
a first differential amplifier comprising:
  input terminals coupled to the first set of parallel connected field-effect transistors; and
  a first differential amplifier output terminal;
a second differential amplifier comprising:
  input terminals coupled to the second set of parallel connected field-effect transistors; and
  a second differential amplifier output terminal; and
a processor coupled to the first and second differential amplifier output terminals and configured to deactivate the first current path and determine whether a field-effect transistor of the first or the second set of parallel connected field-effect transistors is shorted.

15. The apparatus of claim 14, wherein the processor is configured to switch on and maintain on the first or second set of parallel connected field-effect transistors while the first current path is maintained in a deactivated state.

16. The apparatus of claim 14, comprising:
a third set of parallel connected field-effect transistors and a fourth set of parallel connected field-effect transistors in series in the second current path.

17. The apparatus of claim 14, comprising:
a current source coupled to a node in the first current path between the first set of parallel connected field-effect transistors and the second set of parallel connected field-effect transistors.

18. The apparatus of claim 14, comprising:
a first comparator comprising input terminals coupled to the first differential amplifier output terminal and to a terminal of a first reference voltage; and
a second comparator comprising input terminals coupled to the second differential amplifier output terminal and to a terminal of a second reference voltage.

19. The apparatus of claim 18, wherein the first and second reference voltages are threshold voltages of a diode.

20. The apparatus of claim 14, wherein
transistors of the first set of parallel connected field-effect transistors comprise forward diodes in the first current path,
transistors of the second set of parallel connected field-effect transistors comprise blocking diodes in the first current path, and
cathodes of the forward diodes are coupled to cathodes of the blocking diodes.

* * * * *